United States Patent [19]

Nishizawa

[11] Patent Number: 4,816,891
[45] Date of Patent: Mar. 28, 1989

[54] OPTICALLY CONTROLLABLE STATIC INDUCTION THYRISTOR DEVICE

[75] Inventor: Junichi Nishizawa, Miyagi, Japan

[73] Assignee: Handotai Kenkyu Shinkokai, Miyagi, Japan

[21] Appl. No.: 8,059

[22] Filed: Jan. 9, 1987

Related U.S. Application Data

[63] Continuation of Ser. No. 435,449, Oct. 20, 1982, abandoned, which is a continuation of Ser. No. 133,747, Mar. 25, 1980, abandoned.

[30] Foreign Application Priority Data

Mar. 26, 1979 [JP] Japan .................................. 54-36079

[51] Int. Cl.$^4$ ........................................... H01L 29/74
[52] U.S. Cl. ........................................ 357/38; 357/20;
357/22; 357/30; 357/51; 307/631; 307/633; 307/311
[58] Field of Search ........................ 357/20, 22, 38, 51, 357/30; 307/252 L, 311, 631, 633

[56] References Cited

U.S. PATENT DOCUMENTS

| | | | |
|---|---|---|---|
| 3,355,600 | 11/1967 | Mapham | 307/252 L |
| 3,567,972 | 3/1971 | Faust | 307/252 L |
| 3,633,046 | 1/1972 | Dewey | 307/252 L |
| 3,772,532 | 11/1973 | Petrou et al. | 307/252 L |
| 3,986,050 | 10/1976 | Beckmann | 307/252 L |
| 4,170,019 | 10/1979 | Hysell et al. | 357/38 |
| 4,223,328 | 9/1980 | Terasawa et al. | 357/38 |
| 4,224,634 | 9/1980 | Svedberg | 357/38 |
| 4,295,058 | 10/1981 | Lade et al. | 307/311 |

FOREIGN PATENT DOCUMENTS

54-22179 2/1979 Japan .................................. 357/38 T

*Primary Examiner*—Joseph E. Clawson, Jr.
*Attorney, Agent, or Firm*—Sughrue, Mion, Zinn, Macpeak & Seas

[57] ABSTRACT

A semiconductor device comprises a static induction thyristor and a photosensitive element connected to a gate of the static induction thyristor so that the static induction thyristor is controlled optically. A plurality of the semiconductor devices are easily connected in series and/or in parallel with each other to control a large current and/or voltage.

26 Claims, 8 Drawing Sheets

OPTICALLY CONTROLLABLE STATIC INDUCTION THYRISTOR DEVICE

This is a continuation of application Ser. No. 435,449, filed 10-20-82, which is a continuation of application Ser. No. 133,747 filed 3-25-80, both abandoned.

BACKGROUND OF THE INVENTION (a) Field of the Invention

The present invention relates to a semiconductor device including at least one static induction thyristor and a photosensitive control element connected to a gate thereof.

(b) Description of the Prior Art

The conventional thyristor which, basically, is formed by a four-layer structure of pnpn has the drawbacks that it is difficult to carry out switching-off action only by a control of gate voltage, and that even when the switching-off is carried out only by this gate voltage, its speed is very low. In contrast thereto, a static induction thyristor (hereinafter to be called SIT) which is basically constructed by a gated diode structure, i.e. an anode region, cathode region and gate means integrated in either the anode or cathode region, has the features that switching-off operation by the gate voltage is easy, and that its switching-off time is short.

Typical structural examples of the conventional SIT are illustrated in FIGS. 1A to 1E.

FIGS. 1A and 1B are sectional views of the SIT having a surface gate structure and FIG. 1C shows a sectional view of the SIT having an embedded gate structure. In the figures, $p^+$ regions 11 and 14 represent an anode region and a gate region. respectively. An $n^+$ type region 13 represents a cathode region. An $n^-$ type region 12 represents a first region for constituting a channel. Numerals 11', 13' and 14' represent an anode electrode, a cathode electrode, and a gate electrode, respectively which may be made of a layer of Al, Mo, W, Au or other metals, or a low resistivity polysilicon, or their composite layer structure. Numeral 15 represents an insulating layer made of $SiO_2$, $Si_3N_4$, $Al_2O_3$, AlN or like substances, or their mixture, or their composite insulating layer. An n region 16 is of relatively high impurity density, whose thickness is small added to the channel region to restrict the hole injection from the anode.

In FIG. 1D which shows a cross section of the SIT having an insulating gate structure, a $p^+$ region 21 and an i region 22 are an anode region and a first region consituting a channel, respectively, and $n^+$ regions 23 and n region 27 are cathode regions and regions for restricting hole injection from an $p^+$ region 21, respectively. p regions 28 extend vertically with respect to the drawing sheet and reach the surface of the wafer at a suitable position so that they can be connected through electrodes to for example, the cathode region. A reference numeral 25 is the previously mentioned insulating layer. Reference numerals 21', 23' and 24 are the anode electrodes, the cathode electrodes and the insulating gate electrodes, respectively, which were mentioned before.

For example, the $p^+$ gate region 14 in FIG. 1A to 1C is formed in a striped or mesh pattern in plane view.

The distance between the adjacent $p^+$ gate regions 14 and the impurity density of, for example, the $n^-$ regions (in the vicinity of the $p^+$ gate region) are selected such that when a predetermined negative voltage is applied to at least the $p^+$ gates, the $n^-$ region between the $p^+$ gate region 14 becomes completely depleted and there is a high potential barrier formed in a front face of the cathode. Further it is designed such that even when the maximum forward blocking voltage is applied, the depletion layer extending from the $p^+$ gate region 14 does not extended to the anode region so that there is a neutral region of a predetermined thickness left in the $n^-$ region or n region 16 in front of the anode region.

The operation of the SIT thus constructed and the sizes and impurity densities of the respective regions thereof are disclosed in detail in Japanese Patent Application No. 54-8366 of the present applicant.

Since, in the SIT, the switching between conduction and non-conduction is controlled by controlling the potential distribution in the vicinity of the cathode thereof by the gate voltage, it is easy to cut-off d.c. current at a high speed. In the structure shown in FIG. 1A it is possible to design an SIT whose forward blocking voltage is of substantially the same order as that of the reverse breakdown voltage. In the structure shown in FIGS. 1B, 1C or 1D, on the other hand, the same forward blocking voltage as that of the SIT in FIG. 1A can be achieved by using an element whose thickness is substantially half of the thickness of the element in FIG. 1A. Further, the operation speed is high and the forward voltage drop is small which are advantageous. However, the reverse breakdown voltage thereof is small. Therefore, in order to use the SIT having the structure shown in FIG. 1B, 1C or 1D in some device which requires high reverse breakdown voltage, it is usual to connect a Schottky diode or the like in series therewith.

In order to improve the temperature characteristics of the SIT, it may be advisable to employ the opposite conduction type structure. That is, this structure may be provided by substantially regularly and selectively changing the $p^+$ anode region 11 or 21 to n regions and connecting them through electrodes. One example of such structure is shown in FIG. 1E. In FIG. 1E, the resistance of portions of the n region 16 which are parallel to the anode surface and adjacent to the $n^+$ regions 20 is selected such that there is substantially no voltage drop when electrons thermally excited in the high resistance 1 region 12 flow thereinto.

FIGS. 2A and 2B show symbol markings of the junction type SIT and the insulating gate type SIT, respectively. As shown, each of these SITs has a diode in the drain side thereof.

FIGS. 3A and 3B show two examples of typical structures conventional photo-sensitive semiconductor elements in which FIG. 3A shows a photo-conductive element and FIG. 3B shows a photo-transistor.

In FIG. 3A, an i region 32 whose resistance is very high and which can be considered an insulator is formed on an $n^+$ region 31. On both sides thereof, ohmic electrodes 31' and 32' are formed, respectively. The electrodes are, in this example, of $In_2O_2$ or $SnO_2$ which are transparent materials. A lower resistance polysilicon may also be used for them. When the electrode 32' is hardly provided directly, it may be advisable to convert a thin surface portion of the i region 32 into $n^+$ region and then the transparent electrode 32' may be formed thereon.

When the element is illuminated resulting in electron-hole pairs in the i region 32, an electric current will flow. In FIG. 3A, when the electrode 32' is a Schottky electrode, the element may operate as a Schottky diode which is responsive to incident light L with a voltage application thereto being such that the potential at the Schottky electrode side is lower than that at the ohmic electrode 31'.

In FIG. 3B, which shows the photo-transistor, an n+ region 44, a p region 43, an n− region 42 and an n+ region 41 form an emitter region, a base region, a high resistance layer and a collector region, respectively. The photo-transistor has transparent electrodes 41' and 44' for a collector electrode and an emitter electrode, respectively. The n+ region 44 and the p region 43 are thin similar to those of the usual bipolar transistor.

Most of the incident light is absorbed by the n− region 42. When a positive voltage is applied to the collector electrode 41', electrons excited by the light flow into the n+ collector region and are absorbed therein.

On the contrary, holes flow into the p base region, which is a floating region, and accumulate therein. When the accumulated holes become excessive, the p base region 43 is positively charged and so the potential barrier thereof against electrons in the base region is lowered, resulting in that electrons flow from the emitter region to the base region from which they flow into the collector region. In other words, the photo-transistor becomes conductive with light.

In FIG. 3C which shows a thyristor, an n+ region 55 and a p+ region 51 form a cathode region and an anode region, respectively. A transparent electrode 55' is provided on the cathode region 55 and an anode electrode 51' is formed on the anode region 51.

When a positive voltage is applied to the anode electrode 51' and the cathode is illuminated with light L, electrons and holes photo-excited in an i region flow into an n region 52 and a p region 54, respectively. Therefore, the n region 52 is negatively changed and the p region 54 is positively changed. Consequently the barrier potentials against the cathode and anode regions respectively, are lowered and electrons and holes are injected from the cathode and anode regions thereto, respectively, resulting in a conduction state of the tyristor.

Since the thyristor in FIG. 3C has multiplication mechanisms for carrier injection on both sides thereof, the photo-sensitivity thereof is very high.

FIG. 3D shows a p+-i-n+ photo-diode having a transparent electrode 63' and an electrode 61' to which a positive voltage is applied.

In each of the elements in FIGS. 3A to 3D, most of light is absorbed in the i region or n− region to produce electron-hole pairs therein. Therefore, when the electric field strength in such region is selected as being slightly lower than the avalanche field strength, a large amount of carriers may be produced due to the avalanche multiplication mechanism. Therefore, the sensitivity may be more improved. As will be clear, the avalanche multiplication mechanism will disappear by lowering the voltage between the electrode even if the element is in conductive state. It should be noted that the elements in FIGS. 3A to 3D are mere typical and simplest examples and there are many modifications thereof. The thicknesses of the high resistance regions 32, 42, 53 and 62 in the photo-sensitive devices in FIGS. 3A to 3D should be substantially on the order of the light penetrating depths thereinto in view of the highest efficiency. Another example of the photo-sensitive device may be the photovoltiac device.

The SIT and the photo-sensitive semiconductor elements have been described hereinbefore. Although the SIT is characterized by the large operating voltage and current and high switching speed, it is difficult to apply a single SIT in handling a large electric power such as in d.c. power transmission. The breakdown voltage of a single SIT is determined by the thickness of the n− region or i region 12 in FIGS. 1A to 1D, because the electric field strength in at least this region must be weaker than the field strength at which the avalanche breakdown commences. This field strength may be around 200 KV/cm for Si. Further, the thickness of the region 12 is required to be equal to or smaller than the diffusion depth of electron and/or holes. However the maximum forward blocking voltage of the SIT is substantially determined by the semiconductor material to be used. For example when Si is used, the value may be around 5,000 to 10,000 volts. Therefore, it is necessary to connect a plurality of SITs each capable of carrying a current of such as 1,000 amperes in the conductive state and having the forward blocking voltage of, for example, 5,000 or 10,000 volts in series with each other to provide a sufficient breakdown voltage and to connect a plurality of the series connected SITs in parallel with each other to provide a sufficient current capacity. In this case, however, it becomes relatively difficult to control the thyristor array between conduction and non-conduction by using an electric signal. Therefore, it is proposed to control it optically.

SUMMARY OF THE INVENTION

An object of the present invention is to provide an optically controllable static induction thyristor.

Another object of the present invention is to provide an optically controllable static induction thyristor which is suitable to use in a series and/or parallel array.

DETAILED DESCRIPTION OF THE INVENTION

Figure 3A:
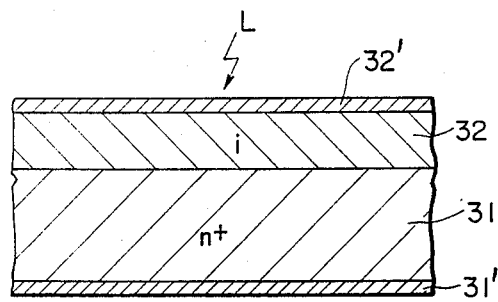
FIGS. 3A to 3D are cross sections showing the photo hypen conductive element, the photo-transistor, the photothyristor and the photodiode, respectively.
Figure 3B:
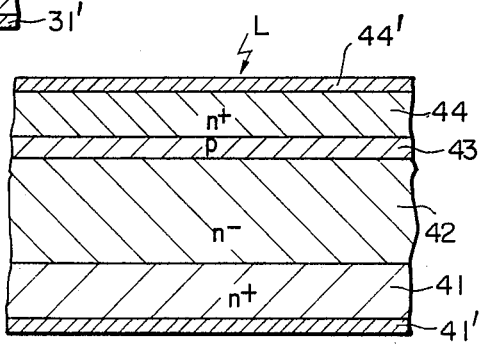
Figure 3C:
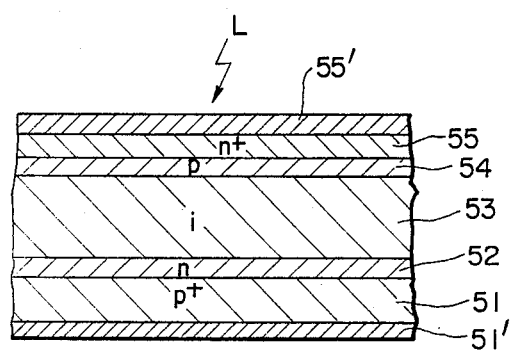
Figure 3D:
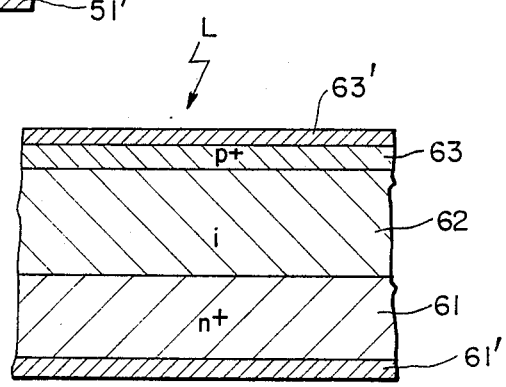
Figure 4A:
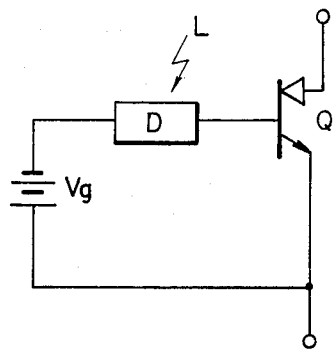
FIGS. 4A to 4E are SIT circuits each having a gate to which a photo-sensitive semiconductor is connected, showing embodiments of the present invention.

In FIG. 4A, a photo-sensitive semiconductor element D, which is any of the photo-sensitive semiconductor in FIGS. 3A and 3D, is connected to a gate of a static induction thyristor Q which is any of the SITs in FIGS. 1A to 1E. A biasing source Vg is connected to the element D in series therewith. The output voltage of the biasing source Vg should be selected according to the SIT to be used. For example, when the SIT selected is capable of blocking a forward voltage of 5,000 volts with a reverse gate bias of −30 volts, the voltage of the source Vg should be on the order of −30 volts.

Since the photo-sensitive element D is conductive during illumination by light L, a voltage −Vg is applied to the gate of the SITO causing the latter to be non-conductive. When the illumination terminates, the element D becomes non-conductive. In this case, if a static capacitance of the element D is selected as being sufficiently smaller than the gate-source capacitance of the SIT, there is substantially no voltage applied to the gate of the SIT. Therefore, the SIT switches its state to conduction. Usually, the size of the element D is small compared with the SIT and therefore the static capacitance of the element D during non-conduction is very small compared with that of the gate of the SIT.

Figure 4B:
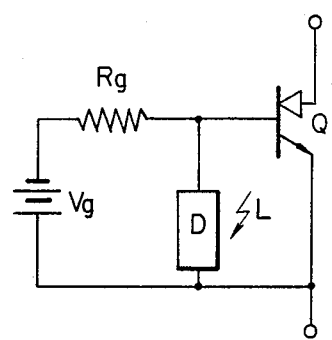

In FIG. 4B, the photo-sensitive element D is connected in parallel with the gate-source of the SIT.

Without light, a voltage −Vg is applied to the gate of the SIT and the latter is in a non-conductive state. On the other hand, with light illumination, the element becomes conductive and thus the potential at the gate becomes substantially the same as that at the source of the SIT. Therefore, the latter becomes conductive. The resistance of the element D in the conductive state is selected as being sufficiently small compared with a resistor Rg connected in parallel to the biasing source Vg.

Figure 4C:
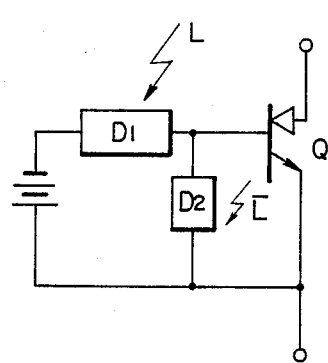
Figure 4D:
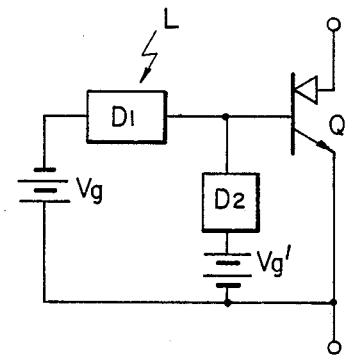

In FIG. 4C a pair of the photo-sensitive elements $D_1$ and $D_2$ are connected in series and in parallel to the gate of the SIT, respectively. The light illuminations to the elements $D_1$ and $D_2$ are made complementary. That is, when the element $D_1$ is illuminated, the element $D_2$ is not illuminated and vice versa. Therefore, the element $D_1$ is switched on while the element $D_2$ is switched off or vice versa, and consequently the thyristor Q is switched off when the element $D_1$ is in the conductive state and switched on when the element $D_2$ is in the conductive state. In FIG. 4D, additional an power source Vg′ is inserted in series with the element $D_2$ in FIG. 4C. This circuit arrangement is effective when the conductive state of the SIT is more clearly set or the SIT is of the MOS type. When the SIT is of the junction type, Vg′ may be on the order of 1 volt. If the SIT is of the MOS type, the value of the power source Vg′ may be much higher than 1 volt.

Figure 4E:
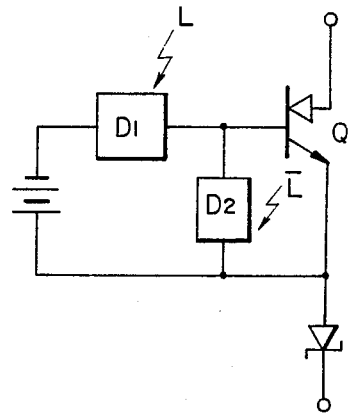

In the case where the reverse breakdown voltage of the SIT is not high, as in the case of the SIT having a structure in any of FIGS. 1A to 1D, and where it is required to have the reverse breakdown voltage during operation of the circuit, it is enough to connect in series a Schottky diode or pin diode having a desired reverse breakdown voltage to the SIT as shown in FIG. 4E.

Figure 5A:
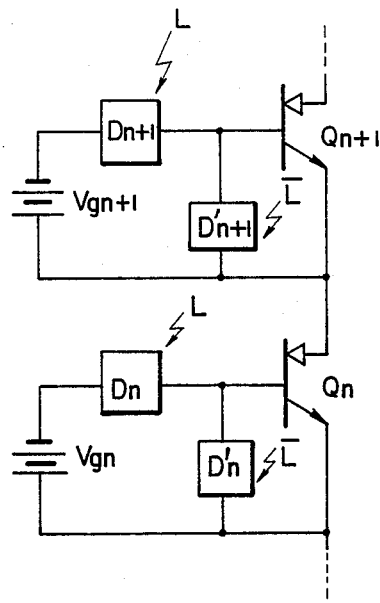
FIGS. 5A to 5B show other examples of the SIT circuits in FIGS. 4A to 4E.
Figure 5B:
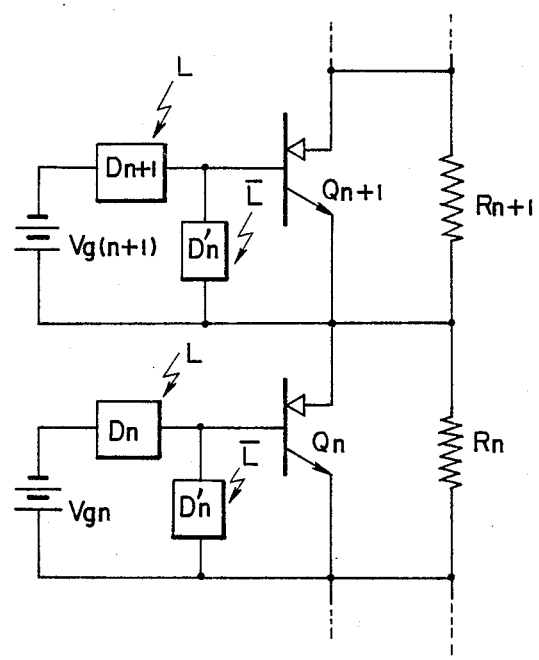

For example, when an AC to DC converter for a d.c. power transmission of one million volts is constructed using the SITs each having a maximum forward blocking voltage of 5,000 volts, the number of the SITs to be connected in series becomes at least 200. FIGS. 5A and 5B show examples of the series connection of the plurality of the SITs which may be of either junction type or MOS type. Since the gates of these SITs are controlled optically, it is easy to control all the SITs simultaneously in synchronism. In this case the light illumination may be performed by using optical fibers etc. so that light signal is evenly supplied to the respective photo-sensitive elements of the SIT circuits. In any case, since the operations of the SITs are not extremely high, it may be possible to use instead of the bundle type optical fiber the clad type optical fiber by which the light in cross sectional area thereof may become more even, although the bundle type optical fiber is effective to guide a triggering optical signal to the respective photo-sensitive elements.

In FIG. 5B, a resistor Ri is further connected in parallel with each SIT. The resistor Rn have the same resistance, i.e., $R_1 = R_2 \ldots = R_n = R_{n+1}$. The purpose of the provision of the parallel resistors $R_n$ is to make the voltage applied to the SITs equal when the SITs are in non-conductive state. The resistance value of the resistor Ri should be as large as possible so long as it is smaller than the resistance between the anode and the cathode of the SIT in the non-conductive state. For example, the value may be 1M ohms although this value is not critical in every case.

Such series connection of the SITs as shown in FIGS. 5A and 5B in which the SIT circuit in FIG. 4C is used can also be effected for other SIT circuits shown in FIGS. 4A, 4B, 4D or 4E.

For further larger current application, a plurality of the series connections of the SITs in FIGS. 5A–5B are connected in parallel.

The SIT circuit in any of FIGS. 4A to 4D can be realized by making either one of the electrodes of the SIT in any of FIGS. 1A to 1E transparent so that light incident on the one surface can reach the high resistance region of the SIT. When Si is used as the semiconductor material for the SIT, the light penetrating depth required may be on the order of 10 to 30 μm. Therefore, in the case where the SIT structure shown in any of FIGS. 1A to 1E is used with a transparent anode electrode, the thickness of the p+ regions 11 or a sum of the thickness of the p+ region 11 and the n region 16 (or the p+ region 21 and the n region 27) should be as small as possible and at least sufficiently thinner than the light penetrating depth. For example, it may be advisable to select the thickness of the p region as being about 5 μm or smaller, the impurity density as being about $1 \times 10^{19}$ cm$^{-3}$ or more, and the thickness of the n region 16 as being about 1 μm or smaller and the impurity density as being about $1 \times 10^{16}$ cm$^{-3}$ or more. The depth of the gate region depends upon the distance between adjacent gate regions and the impurity density of the high resistance region and is usually from several microns to 20 μm. Therefore, using a transparent electrode the SIT becomes controllable with light.

When it is impossible to sufficiently reduce the resistance of the transparent electrode of $In_2O_3$, $SnO_2$ or low resistance polysilicon, it is advisable to provide a metal electrode of a material such as Al in the form of a mesh or stripes at desired positions on the SIT.

The operation of the optically controllable SIT will be described using the structure in FIG. 1B.

Figure 1A:
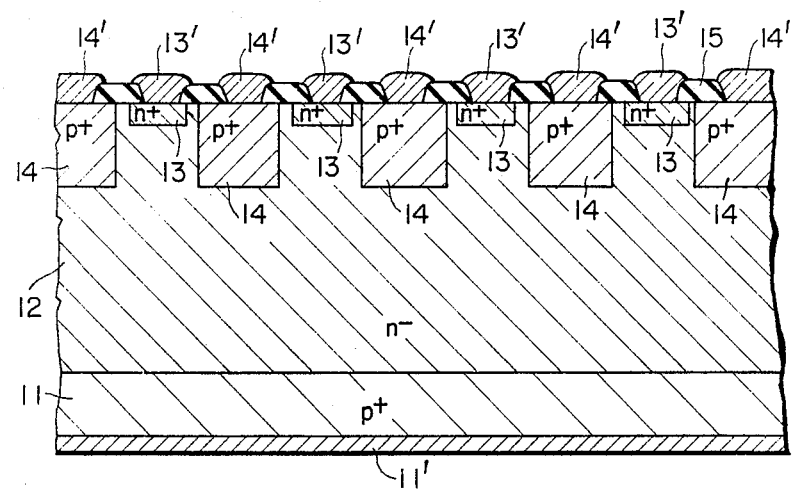
FIGS. 1A to 1E are cross sections showing examples of static induction thyristor.
Figure 1B:
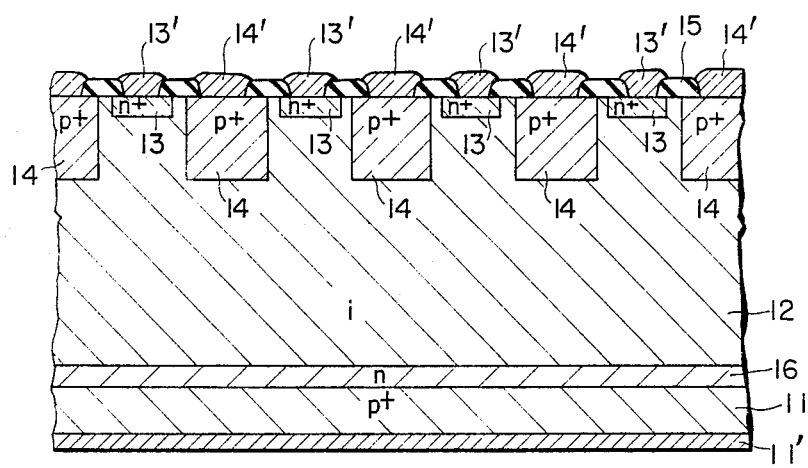
Figure 1C:
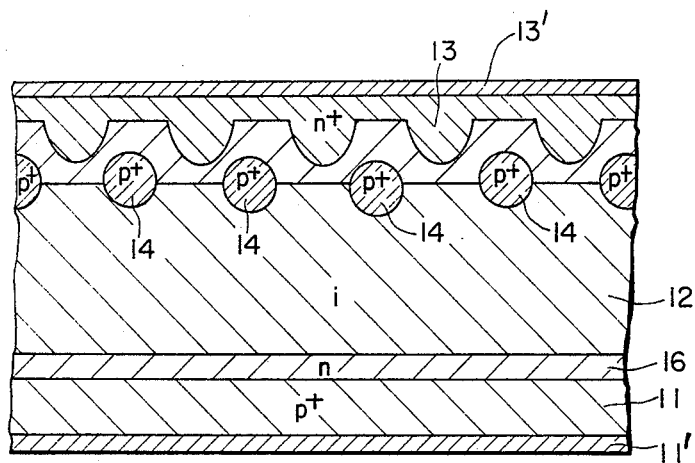
Figure 1D:
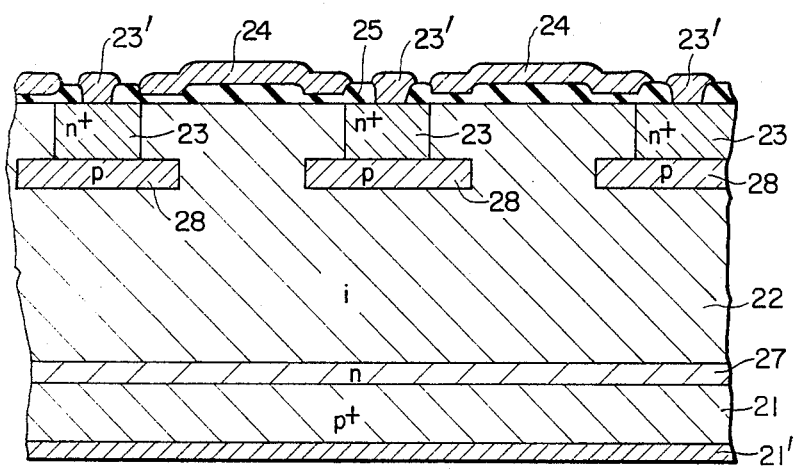
Figure 1E:
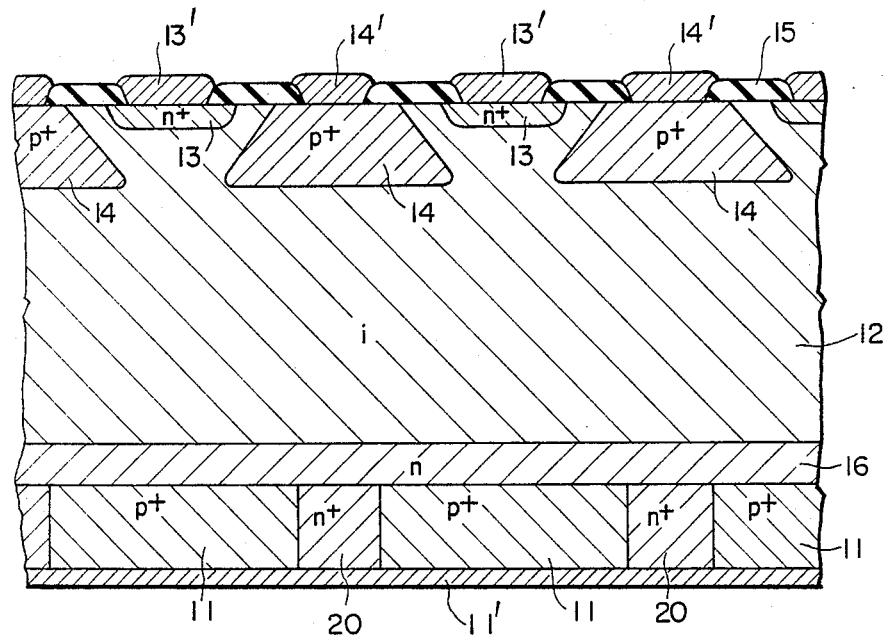
Figure 2A:
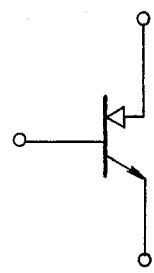
FIGS. 2A and 2B show symbol marks of the static induction thyristors.
Figure 2B:
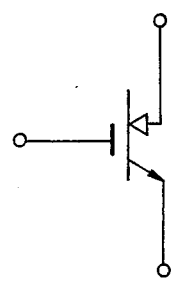

When the structure in FIG. 1B is irradiated with light from the transparent anode electrode, electron-hole pairs are produced in the i region 12. At this time, if a positive volage is applied to the anode, electrons may flow into the n region 16 and charge the region negatively. When the amount of the negative charge in the region 16 increases to some extent, a hole injection may occur from the anode region. Thus, holes produced by optical excitation and holes thus injected flow towards the gate and cathode side. A major portion of holes may flow into the p+ gate region and a portion may flow into the cathode region.

When holes are accumulated in the p+ gate region, the latter is charged negatively, resulting in a lowering of the barrier for electrons formed at the front surface of the cathode. Consequently, electrons are injected thereto from the cathode and accumulated at the front surface of the anode, causing the hole injection from the anode to be enhanced. As a result, the SIT becomes conductive.

In order to lower the forward voltage drop of the SIT in conductive state, it is enough to insert a desired resistor Rgi between the gate-source circuit. The value of the resistor Rgi is selected such that Rgi·Ig becomes nearly equal to the reverse bias voltage applied to the gate, where Ig is a gate current. The resistor Rgi may be provided easily by using polysilicon.

The above matters are also true for the structures in FIGS. 1A and 1C to 1E. It should be noted, however, that, in the case of the structure in FIG. 1C, the resistor is inserted between the p region 28 and the cathode region.

Figure 6A:
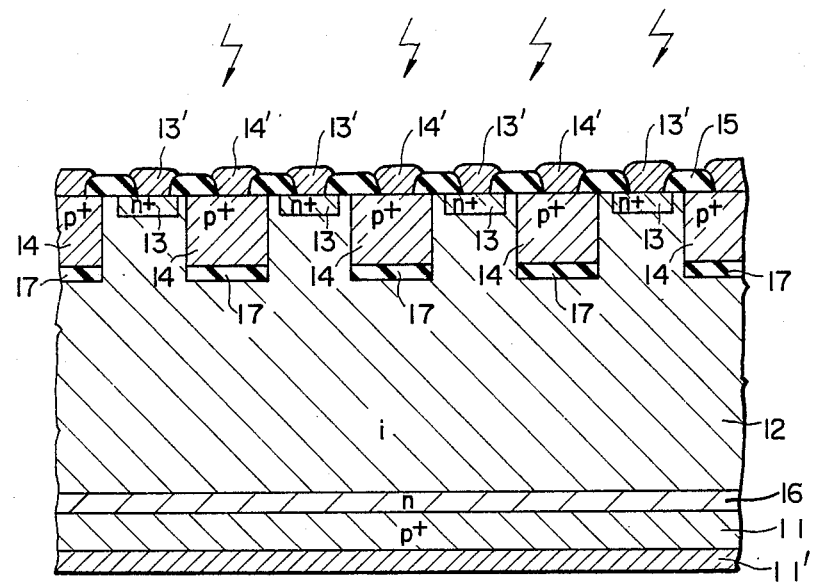
FIG. 6A shows another embodiment of the present invention.
Figure 6B:
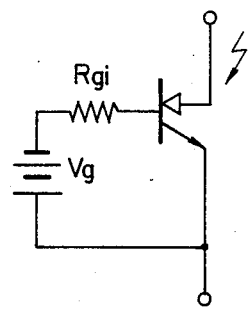
FIG. 6B is an equivalent circuit of the embodment in FIG. 6A.

FIG. 6A is another embodiment of the optically controllable SIT by which the gate current can be minimized while the main current can be increased and FIG. 6B is an equivalent circuit thereof.

In FIG. 6A, an insulating layer 17 of such as $SiO_2$ or $Si_3N_4$ is provided beneath the p+ gate region 14 and polysilicon resistor Rgi (not shown) is provided at a suitable position of the gate 14 extending vertically to the drawing sheet. The resistor Rgi to be connected to the gate may be externally provided.

Figure 7:
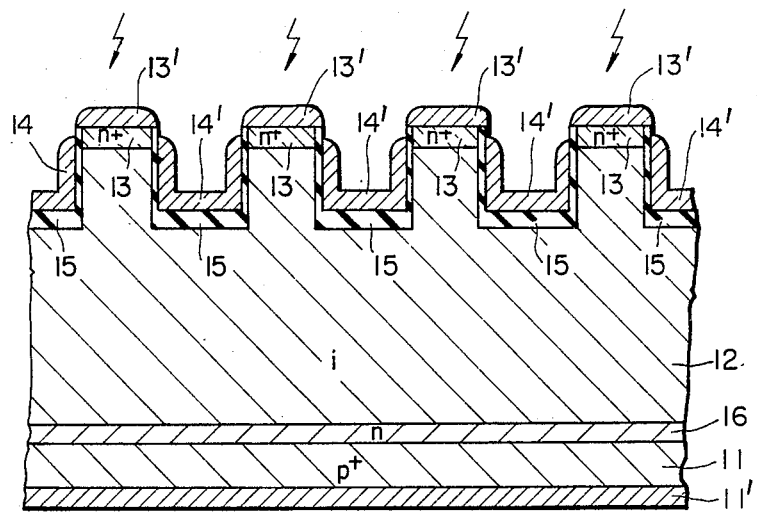
FIG. 7 shows another embodiment of the present invention.

FIG. 7 shows a modification of the embodiment in FIG. 6A, in which the potential barrier in the side of the cathode is diminished by an accumulation of carriers instead of the use of the resistor Rgi.

The negative voltage applied to the gate electrode 14' is completely masked by holes flowing into the vicinity of the gate and thus the potential barrier at the front face of the cathode disappears, resulting in an abrupt electron injection from the cathode. The mechanism of hole injection from the anode is the same as in the embodiment in FIG. 6A.

In FIGS. 6A and 7, the electrodes 13' and 14' are made of a material such as low resistance polysilicon, $In_2O_3$ or $SnO_2$ so that the cathode can be irradiated with light. With this structure, a heat sink can be provided in the anode side. If the heat sink problem is not important, the anode electrode may be made transparent and light directed to it. Alternatively, it is also possible to make both electrodes transparent so that light can be directed to either side.

Figure 8:
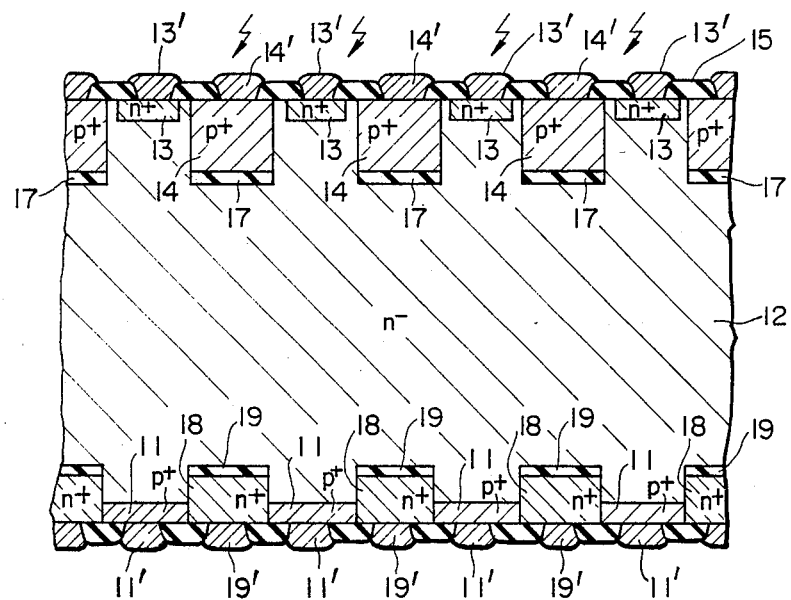
FIG. 8 shows an other embodiment of the present invention.

FIG. 8 shows another modification of the structure in FIG. 6A or 7 in which the gate structure is provided on only the cathode side.

In FIG. 8, the gate structure is also provided on the anode side. With this structure, electrons accumulated in the n region 16 may not disappear due to recombination etc.

In FIG. 8, n+ gate regions 18 are also provided adjacent the p+ anode regions 11, and insulating regions 19 are provided inside the n+ gate regions 18, respectively. In the case where a reverse bias is applied between the anode region 11 and the n+ region 18 similarly to the anode side, the region 12 may be a high resistance i region instead of the n− region. In FIG. 8, a polysilicon resistor (not shown) is formed between the p+ region 11 and the n+ region 18. It may be possible, however, to connect the p+ anode region 11 directly to the n+ region 18 by using an electrode.

The SIT and the photo-sensitive semiconductor element to be connected to the gate of the SIT for controlling the latter between conduction and non-conduction can be formed together on the same silicon wafer, or they can be prepared as separate chips and then connected electrically with lead wires.

The impurity densities and the thicknesses of the regions 12 and 16 may be selected in the manners as described in Japanese Patent Application Nos. 54-8366 and 54-15757.

Although the optically controllable SIT according to the present invention has been described with reference to the preferred embodiments shown in the attached drawings, it may be practiced in other ways. For example, the conductivity types of the respective regions may be reversed. In such case, the polarities of the voltages to be applied thereto should also be reversed. Furthermore, when the SIT used is of the junction type, it is advisable, in view of reduction of capacitance and increase of breakdown voltage, to provide an insulating layer of such as $SiO_2$ between the cathode and anode.

Further, although the p+ gate region 14 in FIG. 1A or 1B is provided as being extended vertically to the drawing sheet, it may be possible to provide the gate region having a portion which is enlarged gradually in cross section with the distance from the surface. With such a structure of the p+ gate region, the voltage gain may be improved.

In the case of an SIT having a junction type gate, it may be possible to form a recess on a surface of a wafer and to provide a P+ region in the recess. A Schottky gate may be used instead of a P-N junction for this purpose.

As to the light source for controlling the SIT, it may be any, provided that electron-hole pairs can be produced in the semiconductor by light emitted thereby and that it can be switched at high speed. For example, it may be possible to use a solid laser, gas laser, semiconductor laser or light emissive diode of such as GaAlAs, InGaP, GaAsP, GaP, ZnSe or ZnS for this purpose.

The optically controllable SIT according to the present invention can be easily manufactured by using a conventional photography technic, diffusion technique, ion injection technique, crystallization technic, epitaxial growth technic, etching technique, oxidation technic, CVD technic and/or wiring technique etc.

The present invention by the SIT which can operate to switch a large voltage and a large current at high speed provides a very effective technic in connecting a plurality of SITs in series and/or in parallel with each other and the industrial advantages of the present invention are remarkable.

What is claimed is:

1. An optically controllable semiconductor device, comprising at least one optically controllable unit for varying the conduction of a controllable current path connected in series between first and second output terminals of said semiconductor device, said optically controllable unit comprising:

a negative bias voltage source having first and second terminals with said first terminal being at a lower potential than said second terminal;

a photo sensitive element having first and second terminals and having a conduction path between said first and second terminals which varies in accordance with optical irradiation of said photo sensitive element, said first terminal of said photo sensitive element being connected to said first terminal of said negative bias voltage source and said second terminal of said photo sensitive element providing an optically controlled bias voltage, said photo sensitive element having a predetermined static capacitance:

an optical source for irradiating said photo sensitive element; and at least one static induction thyristor, said thyristor including a channel region (12) having a first region of relatively low impurity concentration and having a plurality of channel region portions within said first region, said channel region having first and second major surfaces, anode means comprising at least one highly-doped semiconductor anode region (11) formed adjacent said first major surface and being of a first conductivity type, cathode means comprising a plurality of highly-doped cathode regions (13) formed adjacent said second major surface and electrically connected to said second terminal of said negative bias voltage source, said anode, cathode and channel regions being disposed relative to one another in a semiconductor body so as to define respective current paths between said anode region and different ones of said cathode regions through respective channel region portions, said respective current paths comprising said controllable current paths, said static induction thyristor further including gate means responsive to said optically controlled bias voltage for generating depletion regions extending into said channel region portions to control current flow through said current paths, said gate means comprising a plurality of gate portions (14) of said first conductivity type and having an impurity concentration throughout each gate portion of at least $1 \times 10^{19} \text{cm}^{-3}$, said gate portions being electrically connected to one another and to said second terminal of said photo sensitive element, said static induction thyristor turning off in response to a reverse bias between said gate portions and said cathode regions when said photosensitive element provides said negative bias voltage to said gate means upon irradiation of said photosensitive element for quenching said static induction thyristor, said static induction thyristor having a gate-source capacitance which is sufficiently larger than the static capacitance of said photo sensitive element that substantially no voltage is applied to said gate of said static induction thyristor through said photo sensitive element when said irradiation is terminated.

2. An optically controllable semiconductor device according to claim 1, wherein said gate means is connected to said second terminal of said photosensitive element via a gate electrode, and said gate means has a gate structure wherein a portion of each said gate region portion is exposed adjacent said second major surface and is connected electrically to said gate electrode.

3. An optically controllable semiconductor device according to claim 1, wherein said static induction thyristor has an insulated gate structure.

4. An optically controllable semiconductor device according to claim 1, wherein said channel region includes a thin semiconductor layer (16) of a conductivity type different from said first conductivity type sandwiched between said anode region and said first region, said thin layer having an impurity concentration higher than that of said first region and having a thickness much smaller than that of said first region.

5. An optically controllable semiconductor device as claimed in claim 4, wherein said different type is opposite said first conductivity type and wherein said anode means comprises a plurality of said anode regions and at least one further highly-doped semiconductor region of said different conductivity type separating said plurality of anode regions, said plurality of anode regions each being disposed at said first major surface at a position opposite one of said cathode regions, and said further semiconductor region being formed at said first major surface at a position opposite one of said gate portions.

6. An optically controllable semiconductor device as claimed in claim 1, further comprising another photo sensitive element having first and second terminals and a forward bias voltage source having first and second terminals and providing a voltage at its first terminal which is greater than the voltage at its second terminal, said another photo sensitive element and forward bias voltage source being connected in series between said gate means and cathode means of said static induction thyristor with said first terminal of said forward bias voltage source being closer to said gate means.

7. An optically controllable semiconductor device as claimed in claim 1, further comprising a Schottky diode connected in series between said cathode means and said second output terminal of said semiconductor device.

8. An optically controllable semiconductor device as claimed in claim 1, said device comprising a plurality of said optically controllable units having their respective controllable current paths coupled in series with one another between said first and second output terminals of said device to form a compound optically controllable unit.

9. An optically controllable semiconductor device as claimed in claim 8, each said optically controllable unit further comprising a resistor connected between said anode means and cathode means and having a resistance value slightly less than the resistance value of each static induction thyristor when each static induction thyristor is in a non-conductive state.

10. An optically controllable semiconductor device as claimed in claim 8, said device further including a plurality of said compound optically controllable units connected in parallel with one another.

11. An optically controllable semiconductor device, comprising at least one optically controllable unit for varying the conduction of a controllable current path connected in series between first and second output terminals of said semiconductor device, said optically controllable unit comprising:

a negative bias voltage source having first and second terminals with said first terminal being at a lower potential than said second terminal;

first and second photo sensitive elements each having first and second terminals and each having a conduction path between said first and second terminals the conductance of which varies in accordance with optical irradiation of each respective photo sensitive element, said first terminal of said first photo sensitive element being connected to said first terminal of said negative bias voltage source, said second terminal of said first photo sensitive element being connected to a first connection point for providing an optically controllable bias voltage, said second terminal of said negative bias voltage source being connected to a second connection point, said second photo sensitive element having its conduction path coupled between said first and second connection points;

an optical source for providing a first irradiation and a second irradiation complementary to said first irradiation for irradiating said first and second photosensitive elements; and at least one static induction thyristor, said thyristor including a channel region having a first region of relatively low impurity concentration and having a plurality of channel region portions, said channel region having first and second major surfaces, anode means comprising at least one highly-doped semiconductor anode region formed adjacent said first major surface and being of a first conductivity type, cathode means comprising a plurality of highly-doped cathode regions formed adjacent said second major surface and electrically connected to said second connection point, said anode, cathode and channel regions being disposed relative to one another in a semiconductor body so as to define respective current paths between said at least one anode region and different ones of said cathode regions through respective channel region portions, said respective current paths comprising said controllable current path, said static induction thyristor further including gate means responsive to said optically controlled bias voltage for generating depletion regions extending into said channel region portions to control current flow through said respective current paths, said gate means comprising a plurality of gate portions of said first conductivity type and having an impurity concentration throughout each gate portion of at least $1 \times 10^{19} \text{cm}^{-3}$, said gate portions being electrically connected to one another and to said first connection point, said first and second photosensitive elements receiving said first and second complementary irradiations, respectively, one for triggering and the other for quenching said static induction thyristor, said static induction thyristor turning off in response to a reverse bias between said gate portions and said cathode regions when said first photosensitive element provides said negative bias voltage to said gate means.

12. An optically controllable semiconductor device according to claim 11, wherein said gate means is connected to said first connection point via a gate electrode, and said gate means has a gate structure wherein a portion of each said gate region portion is exposed adjacent said second major surface and is connected electrically to said gate electrode.

13. An optically controllable semiconductor device according to claim 11, wherein said static induction thyristor has an insulated gate structure.

14. An optically controllable semiconductor device according to claim 11, wherein said channel region includes a thin semiconductor layer (16) of a conductivity type different from said first conductivity type sandwiched between said anode region and said first region, said thin layer having an impurity concentration higher than that of said first region and having a thickness much smaller than that of said first region.

15. An optically controllable semiconductor device as claimed in claim 14, wherein said different conductivity type is opposite said first conductivity type and wherein said anode means comprises a plurality of said anode regions and at least one further high-doped semiconductor region of said different conductivity type separating said plurality of anode regions, said plurality of anode regions each being disposed at said first major surface at a position opposite one of said cathode regions, and said further semiconductor region being formed at said first major surface at a position opposite one of said gate portions.

16. An optically controllable semiconductor device as claimed in claim 11, each said optically controllable unit further comprising a second bias voltage source having first and second terminals and having a potential at its first terminal higher than at its second terminal, said second bias voltage source being connected in series with said second photo sensitive element between said first and second connection points and having its first terminal closer to said first connection point.

17. An optically controllable semiconductor device as claimed in claim 11, further comprising a Schottky diode connected in series between said cathode means and said second output terminal of said semiconductor device.

18. An optically controllable semiconductor device as claimed in claim 11, said device comprising a plurality of said optically controllable units having their respective controllable current paths coupled in series with one another between said first and second output terminals of said device to form a compound optically controllable unit.

19. An optically controllable semiconductor device as claimed in claim 18, each said optically controllable unit further comprising a resistor connected between said anode means and cathode means and having a resistance value slightly less than the resistance value of each static induction thyristor when each static induction thyristor is in a non-conductive state.

20. An optically controllable semiconductor device as claimed in claim 18, said device further including a plurality of said compound optically controllable units connected in parallel with one another.

21. An optically controllable semiconductor device, comprising at least one optically controllable unit for varying the conduction of a controllable current path connected in series between first and second output terminals of said semiconductor device, said optically controllable unit comprising:

a negative bias voltage source having first and second terminals with said first terminal being at a lower potential than said second terminal;

a photo sensitive element having first and second terminals and having a conduction path between said first and second terminals which varies in accordance with optical irradiation of said photo sensitive element, said first terminal of said photo sensitive element being connected to said first terminal of said negative bias voltage source and said second terminal of said photo sensitive element providing an optically controlled bias voltage, said photo sensitive element having a predetermined static capacitance;

an optical source for irradiating said photo sensitive element; and at least one static induction thyristor, said thyristor including a channel region (12) having a first region of relatively low impurity concentration and having a plurality of channel region portions within said first region, said channel region having first and second major surfaces, anode means comprising at least one highly-doped semiconductor anode region (11) formed adjacent said first major surface and being of a first conductivity type, cathode means comprising a plurality of highly-doped cathode region (13) formed adjacent said second major surface and electrically connected to said second terminal of said negative bias voltage source, said anode, cathode and channel regions being disposed relative to one another in a semiconductor body so as to define respective current paths between said anode region and different ones of said cathode regions through respective channel region portions, said respective current paths comprising said controllable current paths, said static induction thyristor further including gate means responsive to said optically controlled bias voltage for generating depletion regions extending into said channel region portions to control current flow through said current paths, said gate means comprising a plurality of gate portions (14) of said first conductivity type and having an impurity concentration throughout each gate portion of at least $1 \times 10^{19} cm^{-3}$, said gate portions being electrically connected to one another and to said second terminal of said photo sensitive element, said static induction thyristor turning off in response to a reverse bias between said gate portions and said cathode regions when said photosensitive element provides said negative bias voltage to said gate means upon irradiation of said photosensitive element for quenching said static induction thyristor, said static induction thyristor having a gate-source capacitance which is sufficiently larger than the static capacitance of said photo sensitive element that substantially no voltage is applied to said gate of said static induction thyristor through said photo sensitive element when said irradiation is terminated, said anode means comprising a plurality of said anode regions and at least one further highly-doped region of a conductivity type different from said first conductivity type separating said plurality of anode regions, said plurality of anode regions each being disposed at said first major surface at a position opposite one of said cathode regions, and said further semiconductor region being formed at said first major surface at a position opposite said gate means.

22. An optically controllable semiconductor device as claimed in claim 21, said device comprising a plurality of said optically controllable units having their respective controllable current paths coupled in series with one another between said first and second output terminals of said device to form a compound optically controllable unit.

23. An optically controllable semiconductor device as claimed in claim 22, each said optically controllable unit further comprising a resistor connected between said anode means and cathode means and having a resistance value slightly less than the resistance value of each static induction thyristor when each static induction thyristor is in a non-conductive state.

24. An optically controllable semiconductor device, comprising a plurality of optically controllable units each for varying the conduction of a controllable current path connected in series between first and second output terminals of said semiconductor device, said optically controllable units having their respective controllable current paths coupled in series with one another between said first and second output terminals of said device to form a compound optically controllable unit, each said optically controllable unit comprising:

a negative bias voltage source having first and second terminals with said first terminal being at a lower potential than said second terminal;

first and second photo sensitive elements each having first and second terminals and each having a conduction path between said first and second terminals the conductance of which varies in accordance with optical irradiation of each respective photo sensitive element, said first terminal of said first photo sensitive element being connected to said first terminal of said negative bias voltage source, said second terminal of said first photo sensitive element being connected to a first connection point for providing an optically controllable bias voltage, said second terminal of said negative bias voltage source being connected to a second connection point, said second photo sensitive element having its conduction path coupled between said first and second connection points;

an optical source for providing a first irradiation and a second irradiation complementary to said first irradiation for irradiating said first and second photosensitive elements; and at least one static induction thyristor, said thyristor including: a channel region having a first region of relatively low impurity concentration and having a plurality of channel region portions, said channel region having first and second major surfaces; anode means comprising a plurality of highly-doped semiconductor anode regions formed adjacent said first major surface and being of a first conductivity type and at least one further highly-doped semiconductor region of a conductivity type opposite said first conductivity type separating said plurality of anode regions, said anode means including a thin semiconductor layer (16) of said opposite conductivity type sandwiched between said anode regions and said channel region, said thin layer having an impurity concentration higher than that of said channel region and having a thickness much smaller than that of said channel region; cathode means comprising a plurality of highly-doped cathode regions formed adjacent said second major surface and electrically connected to said second connection point, said anode, cathode and channel regions being disposed relative to one another in a semiconductor body with said anode regions each being disposed at a position opposite one of said cathode regions and said further semiconductor region being formed opposite said gate means so as to define respective current paths between respective anode regions and different ones of said cathode regions through respective channel region portions, said respective current paths comprising said controllable current paths; said static induction thyristor further including gate means responsive to said optically controlled bias voltage for generating depletion regions extending into said channel region portions to control current flow through said current paths, said gate means comprising a plurality of gate portions of said first conductivity type and having an impurity concentration throughout each gate portion of at least $1 \times 10^{19} cm^{-3}$, said gate portions being electrically connected to one another and to said first connection point, said first and second photosensitive elements receiving said first and second complementary irradiations, respectively, one for triggering and the other for quenching said static induction thyristor, said static induction thyristor turning off in response to a reverse bias between said gate portions and said cathode regions when said first photosensitive element provides said negative bias voltage to said gate means.

25. An optically controllable semiconductor device, comprising at least one optically controllable unit for varying the conduction of a controllable current path connected in series between first and second output terminals of said semiconductor device, said optically controllable unit comprising:

a negative bias voltage source having first and second terminals with said first terminal being at a lower potential than said second terminal;

a photo sensitive element having first and second terminals and having a conduction path between said first and second terminals which varies in accordance with optical irradiation of said photo sensitive element, said first terminal of said photo sensitive element being connected to said first terminal of said negative bias voltage source and said second terminal of said photo sensitive element providing an optically controlled bias voltage;

an optical source for irradiating said photo sensitive element;

at least one static induction thyristor, said thyristor including a channel region (12) having a first region of relatively low impurity concentration and having a plurality of channel region portions within said first region, said channel region having first and second major surfaces, anode means comprising at least one highly-doped semiconductor anode region (11) formed adjacent said first major surface and being of a first conductivity type, cathode means comprising a plurality of highly-doped cathode regions (13) formed adjacent said second major surface and electrically connected to said second terminal of said negative bias voltage source, said anode, cathode and channel regions being disposed relative to one another in a semiconductor body so as to define respective current paths between said anode region and different ones of said cathode regions through respective channel region portions, said respective current paths comprising said controllable current paths, said static induction thyristor further including gate means responsive to said optically controlled bias voltage for generating depletion regions extending into said channel region portions to control current flow through said current paths, said gate means comprising a plurality of gate portions (14) of said first conductivity type and having an impurity concentration throughout each gate portion of at least $1 \times 10^{19} cm^{-3}$, said gate portions being electrically connected to one another and to said second terminal of said photo sensitive element, said static induction thyristor turning off in response to a reverse bias between said gate portions and said cathode regions when said photosensitive element provides said negative bias voltage to said gate means upon irradiation of said photosensitive element for quenching said static induction thyristor; and another photosensitive element connected between said gate means and said cathode means of said static induction thyristor, said first-mentioned photosensitive element and said another photosensitive element receiving complementary optical irradiation, one for triggering and the other for quenching said static induction thyristor.

26. An optically controllable semiconductor device as claimed in claim 24, each said optically controllable unit further comprising a resistor connected between said anode means and cathode means and having a resistance value slightly less than the resistance value of each static induction thyristor when each static induction thyristor is in a non-conductive state.

* * * * *